United States Patent [19]

Patel

[11] 4,057,821

[45] Nov. 8, 1977

[54] NON-VOLATILE SEMICONDUCTOR MEMORY DEVICE

[75] Inventor: Pramodbhai D. Patel, San Jose, Calif.

[73] Assignee: Nitron Corporation/McDonnell-Douglas Corporation, Long Beach, Calif.

[21] Appl. No.: 633,879

[22] Filed: Nov. 20, 1975

[51] Int. Cl.² ............... H01L 29/78; H01L 29/34
[52] U.S. Cl. ............................. 357/23; 357/54; 365/182
[58] Field of Search ............... 357/23, 54; 340/173

[56] References Cited

U.S. PATENT DOCUMENTS

| | | | |
|---|---|---|---|
| 3,649,884 | 3/1972 | Haneta | 357/54 |
| 3,719,866 | 3/1973 | Naber et al. | 357/23 |
| 3,793,090 | 2/1974 | Barile et al. | 357/54 |
| 3,821,566 | 6/1974 | Cricchi | 357/23 |
| 3,845,327 | 10/1974 | Cricchi | 357/23 |
| 3,846,768 | 11/1974 | Krick | 357/54 |
| 3,853,496 | 12/1974 | Kim | 357/23 |
| 3,859,642 | 1/1975 | Mar | 357/54 |
| 3,906,296 | 9/1975 | Maserjian | 357/23 |
| 3,925,804 | 12/1975 | Cricchi et al. | 357/23 |

OTHER PUBLICATIONS

Metal-Insulator-Trap-Oxide-Semiconductor Memory Cell; by Augsta et al., IBM Technical Disclosure Bulletin, vol. 13, No. 12, May 1971, p. 3636.

Primary Examiner—Andrew J. James
Attorney, Agent, or Firm—Townsend and Townsend

[57] ABSTRACT

An improved MNOS IGFET with stable long term memory retention, hysteresis and capable of LSI fabrication with reproducible electrical characteristics. The device comprises a field oxide adhered to a semiconductive substrate of a first conductivity type having a spaced pair of diffusion regions of opposite conductivity type separated by an interstitial layer of the substrate; a composite dielectric layer adhered to the oxide layer, the composite layer comprising a first dielectric layer adhered directly to the oxide layer and a second dielectric layer adhered to the first dielectric layer; and a conductive electrode adhered to the second dielectric layer.

The first dielectric layer has a thickness in the range from about 20% to about 50% of the total thickness of the composite dielectric layer, and the electrical conductivity of the second dielectric layer is less than that of the first dielectric layer.

The first dielectric layer is formed by a nitrogen carrier gas diffusion step performed at a temperature in the range from about 650° to about 850° C; the second dielectric layer is formed by a hydrogen carrier gas diffusion step performed at a temperature in the range from about 900° to about 1150° C.

7 Claims, 7 Drawing Figures

NON-VOLATILE SEMICONDUCTOR MEMORY DEVICE

BACKGROUND OF THE INVENTION

This invention relates to the field of non-volatile semiconductor memory devices. More particularly, this invention relates to an improved semiconductor memory device of the insulated gate field effect transistor (IGFET) type and a method of fabricating same.

Non-volatile semiconductor memory devices are known which typically employ a large scale integration (LSI) array of individual IGFET elements with suitable interconnections to function as a multibit storage device, such as a read only memory (ROM), a read mostly memory (RMM), an electronically alterable read only memory (EAROM), a random access memory (RAM) or the like. Each IGFET element typically comprises a semiconductor substrate material of a first conductivity type, a pair of source and drain diffusion regions of opposite conductivity type from the substrate separated by an interstitial portion of the substrate material, an overlying field oxide layer of minimum thickness in the region overlying the interstitial substrate portion, a layer of a dielectric material over the field oxide and a gate electrode metallization layer overlying the dielectric material. The IGFET element can be operated as a two-state memory device by virtue of the variable threshold switching property exhibited by devices of this type. In a conventional field effect transistor, the threshold voltage which must be applied between the gate and the source electrodes to cause substantial current conduction between the drain and the source electrodes is fixed. In IGFET devices, on the other hand, this threshold can be altered by applying a relatively large potential difference between the gate electrode and the substrate. The threshold voltage may be altered back to an initial level by applying a relatively large potential difference of opposite polarity between the gate and the substrate. If the two different threshold voltages are well defined and of sufficiently different magnitude, an IGFET may be operated as a bistable memory device by arbitrarily assigning one and zero values to the different threshold voltages, selectively altering the threshold voltage and subsequently interrogating the IGFET with a voltage whose magnitude lies between the two different threshold voltages while sensing the source-to-drain current. Circuits have been designed employing IGFET as bistable memory elements, and several representative circuits are shown in U.S. Pat. No. 3,636,530.

Metal-nitride-oxide-silicon (MNOS) IGFET memory devices using silicon nitride as the dielectric element have been fabricated for use as bistable memory elements and, while MNOS implementation has many theoretical advantages, the performance of such devices has been found unsatisfactory for several reasons. In order to be commercially acceptable, the cost of each IGFET must be kept to a minimum by employing LSI semiconductor fabrication techniques with relatively high yield. In addition, each IGFET must have the capacity to remain at either threshold voltage state for a relatively long period of time in order to be useful as a non-volatile memory element. Efforts to date to fabricate MNOS IGFETS of consistent quality and performance and acceptable retention periods have not yet met with success.

SUMMARY OF THE INVENTION

The invention comprises a method for fabricating an IGFET having predictable electrical characteristics and excellent retention properties, and the article so produced.

The method proceeds by forming a semiconductive substrate of a first conductivity-type material, forming a pair of laterally spaced diffusion regions of opposite conductivity type to the substrate material adjacent one surface of the substrate and forming a field oxide layer over the diffusion region and the interstitial substrate material, with the field oxide having a substantially smaller thickness in the region overlying the interstitial substrate material. A first layer of silicon nitride dielectric material is deposited to a first predetermined thickness over the oxide layer using a nitrogen carrier gas maintained within a low temperature range, and a second layer of silicon nitride is deposited to a second predetermined thickness over the first layer in hydrogen carrier gas maintained within a high temperature range, with the first layer having a thickness in the range from about 25 to about 50% of the total thickness of both silicon nitride layers. The IGFET is completed by depositing a metallization layer over the composite dielectric layer to form a gate electrode.

The preferred low temperature range is from about 650° to about 850° centigrade, with an optimum temperature of substantially 835° C. The preferred high temperature range is from about 900° to about 1150° C., with an optimum temperature of substantially 1150° C. The total deposition time of the dielectric layer is dependent upon the deposition rate which varies in a known way with temperature and is chosen so that the resulting two dielectric layers have the relative thickness specified above.

The resulting IGFET comprises a semiconductor memory element having a semiconductive substrate of a first conductivity type, a pair of laterally spaced diffusion regions of opposite conductivity type to the substrate separated by an interstitial portion of said substrate adjacent one surface thereof, a field oxide layer adhered to the diffusion regions and the interstitial substrate portion, with the thickness of the field oxide being minimum in the region thereof overlying the interstitial substrate portion, a composite dielectric layer overlying the field oxide layer and including a first dielectric layer immediately adjacent the field oxide layer and a second dielectric layer overlying the first dielectric layer, the ratio of the thickness of the first and second dielectric layers lying in the range from about 1:4 to about 1:1, and a metallization gate electrode overlying the composite dielectric layer in the region of the diffusion regions and the interstitial substrate region. The conductivity of the first dielectric layer is selected to be greater than the conductivity of the second layer. The device exhibits highly stable long-term memory retention, extremely fast write and erase switching times and other highly stable electrical characteristics.

For a fuller understanding of the nature and advantages of the invention, reference should be had to the ensuing detailed description taken in conjunction with the accompanying drawings.

DESCRIPTION OF THE PREFERRED EMBODIMENTS

Figure 1:
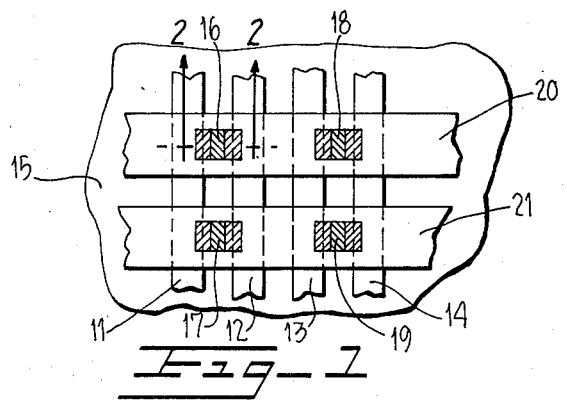
Fig. 1 is a schematic plan view of an IGFET memory array.

Turning now to the drawings, FIG. 1 is a schematic plan view of a multi-bit IGFET memory array. For purposes of illustration, only four bits are shown; however, it is understood that in practice the memory array is fabricated with a substantially greater number of bits. As shown in FIG. 1, a plurality of diffusion channels 11-14 are formed in a substrate material 15, with the diffusion channels 11-14 being of opposite conductivity type to semiconductor substrate material 15.

Interspersed between adjacent channels 11, 12 and 13, 14 are a plurality of gate regions 16-19 shown shaded for illustrative purposes only. Overlying gate regions 16-19 and electrically isolated from diffusion channels 11-14 are a pair of metallization layers 20, 21 which form gate electrodes for the gate regions 16-19.

Figure 2:
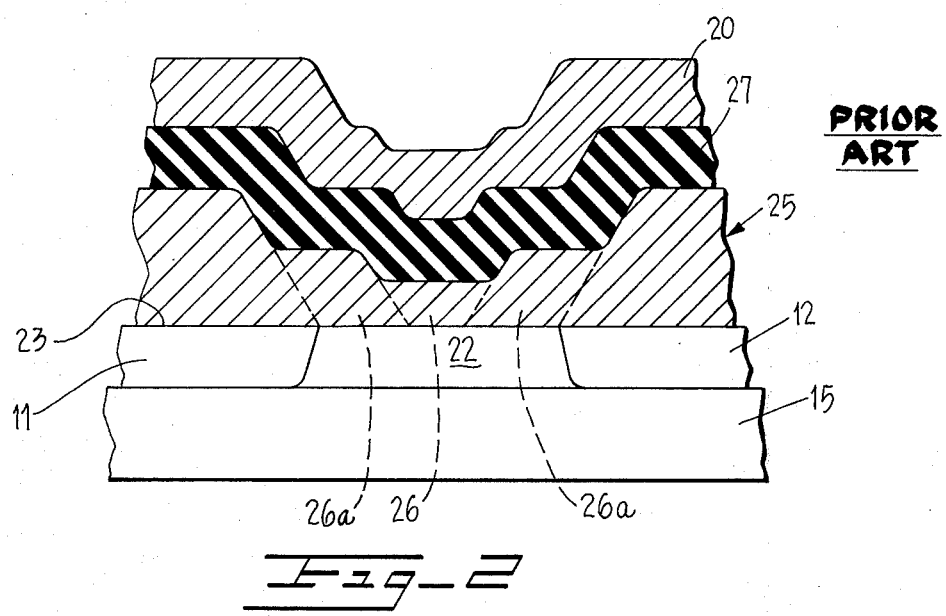
FIG. 2 is a sectional view taken along lines 2—2 of FIG. 1 showing prior art structure.

FIG. 2 is a sectional view taken along lines 2—2 of FIG. 1 illustrating an MNOS IGFET fabricated according to the prior art. As seen in this FIGURE, each MNOS IGFET comprises a composite structure including semiconductive substrate 15, preferably of N-type material, diffusion regions 11, 12 of opposite conductivity type, preferably of P-type material, and serving as the source and drain respectively of the IGFET. Diffusion regions 11, 12 are separated by interstitial portion 22 of substrate 15, and elements 11, 12 and 22 share a common upper terminating surface 23. Adhered to surface 23 is layer of field oxide material, preferably silicon dioxide ($SiO_2$), having variable thickness as shown. The thickness of field oxide layer 25 is a minimum in the gate region 26 over interstitial portion 22 of substrate 15. This minimum thickness should preferably not exceed 20 A. The thickness of field oxide layer 25 increases to an intermediate value of about 1400 A in the split mask region 26a, and to a maximum of several thousand A in the region over the diffusion regions 11, 12 and this thickness is maintained between adjacent diffusion regions (not shown), e.g. between regions 12 and 13 of FIG. 1.

Overlying the field oxide layer 25 is a dielectric layer perferably composed of silicon nitride ($Si_3N_4$) typically formed to a thickness in the range from about 450 to about 850 A within a tolerance ±50 A. Overlying dielectric layer 27 is the metallization layer 20 typically composed of aluminum.

One of the critical steps in the formation of the IGFET of FIG. 2 is the formation of the dielectric layer 27. In the past, this layer has been typically formed by one of two alternate processes both involving the ammoniation of silane ($SiH_4$). According to the first known process, the silane is mixed with a nitrogen carrier gas maintained in a temperature range typically from about 700° to about 850° C. In the second known process, the silane is mixed with a hydrogen carrier gas maintained in a temperature range from about 900° to about 1200° C.

Figure 3:
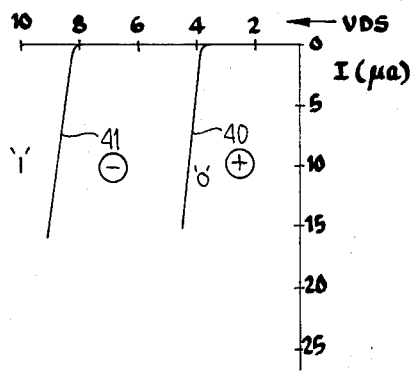
FIG. 3 is a graph of an idealized memory hysteresis curve of an MNOS IGFET.

In use, when an electric field is applied across the gate region, carriers (electrons or holes) tunnel through the thin gate region 26 of oxide layer 25 and are trapped in the silicon nitride layer 27. This produces a low or a high threshold voltage, depending on the polarity of the applied field. The key electrical property for proper operation of the MNOS IGFET as a memory device is the memory hysteresis. Ideally, the memory hysteresis should resemble that shown in FIG. 3 in which the ordinate represents source-to-drain current and the abscissa is gate voltage. Curve 40 represents the variation of current with voltage when the device is in a first threshold state resulting from the application of a positive potential of 30 volts between the gate electrode and substrate 15. Curve 41 represents the variation of current with voltage when the device is in a second threshold state resulting from the application of a potential difference of minus 30 volts between the gate electrode and substrate 15. The curves 40, 41 for the IGFET should be predictable in magnitude, repeatable over numerous read/write cycles and should exhibit little or no variation with absolute lifetime of the device. In addition, the threshold differential $\Delta v_t$, which is the difference in magnitude between the two threshold voltages, should be substantially constant over the lifetime of the device and over at least a narrow range of variation of the applied field potential.

The threshold voltages, fast surface states, and fixed charges (QSS) of an MNOS IGFET can all be controlled with the carrier gas used in the silicon nitride deposition process. Electrical characteristics are very sensitive to temperature variations, the ratio of silane to ammonia during the deposition process, and any trace impurities such as oxygen, carbon monoixde, carbon dioxide and the like.

MNOS IGFET fabricated in accordance with the high temperature hydrogen carrier gas dielectric deposition process noted above have been found to exhibit reproducible threshold voltages but poor hysteresis characteristics, with yields varying from 0 to 30 percent with no repeatability. These poor results are most probably related to accompanying adverse structural effects on the extremely thin gate region 26 of the field oxide layer 25. MNOS IGFETs fabricated with the low temperature nitrogen carrier gas dielectric deposition process have been found to exhibit good hysteresis characteristics but poor retention properties and poor yields.

Figure 4:
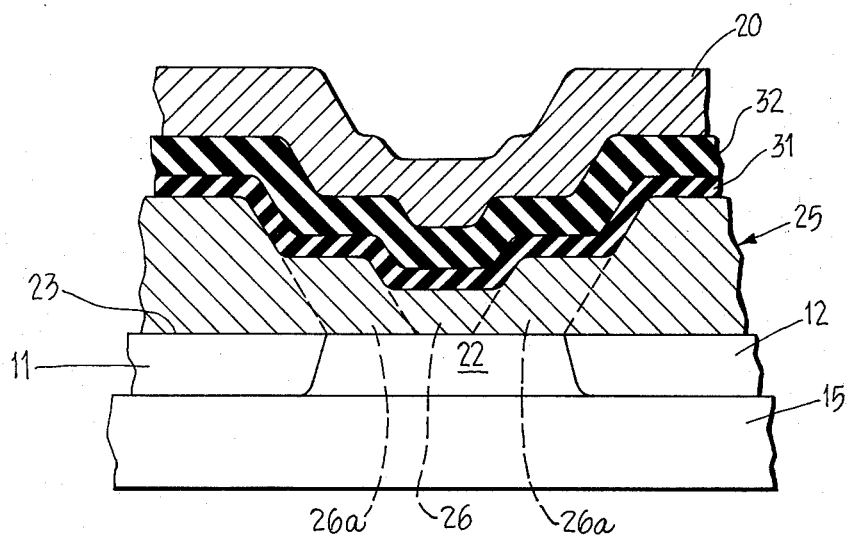
FIG. 4 is a sectional view taken after FIG 2 illustrating the invention.

FIG. 4 is a sectional view taken after FIG. 2 illustrating an MNOS IGFET fabricated in accordance with the teachings of the invention. As seen in this FIGURE, the novel MNOS IGFET exhibits a structure which partially resembles the prior art device of FIG. 2 and includes opposite conductivity type diffusion regions 11, 12, substrate 15 with interstitial region 22 and field oxide layer 25 with extremely thin gate region 26 and split gate regions 26a. In the FIG. 3 device, however, there is a composite dielectric layer consisting of a first lower layer 31 and a second upper layer 32, with the metallization layer 20 applied over the latter.

First dielectric layer 31 comprises silicon nitride deposited with a low temperature nitrogen carrier gas, while second dielectric layer 32 comprises silicon nitride deposited with a high temperature hydrogen carrier gas.

The MNOS IGFETs of FIG. 4 are batch fabricated in accordance with the following process. A starting wafer of N type substrate material having known resistivity and crystal orientation is acid cleaned, rinsed in water and spray dried with dry nitrogen. An oxide layer (silicon dioxide) is thermally grown to provide a mask for diffusion of the source and drain P type regions. The P type regions are next formed by a conventional boron diffusion using the oxide layer as a mask.

The gate area (regions 26 and 26a) are next exposed by etching away the oxide mask after which a gate oxide layer of substantially 1400 A is thermally grown at a temperature of from about 9500° C. to about 1000° C. The thin nitride gate area 26 is next etched out, and a thin layer of silicon dioxide is chemically grown to a thickness of from about 15 to about 20 A.

The first nitride layer 31 is next formed by chemical vapor deposition using a nitrogen carrier gas and a mixture of ammonia and silane in a ratio no less than 500 (ammonia to silane). This deposition is carried out at a temperature in the range from about 650° to about 850° C, the optimum temperature preferably being 835° C. Second silicon nitride layer 32 is next formed also by chemical vapor deposition using a hydrogen carrier gas and the same ratio of ammonia to silane, at a temperature in the range from about 900° to about 1150° C., preferably at the optimum temperature of 1150° C.

The device is completed by etching away the nitride layer over the diffusion regions to expose the latter, and providing metallization contacts for the diffusion regions (not shown) and for the nitride gate region; followed by a conventional low temperature vapor deposition to provide a passivation layer of silicon dioxide.

It should be noted that the metallization contacts are conventional and have been omitted from FIGS. 2 and 4 for simplicity.

It should further be noted that the optimum combined thickness of dielectric layers 31 and 32 is about 650 A ± 50 A units. The thickness of each layer can be controlled using conventional techniques for timing the deposition period for each layer, which include published deposition rates for various silane concentration and ammonia concentrations.

By depositing first dielectric layer 31 with a nitrogen carrier gas, the amount of interface contamination is minimized and the Qss level is exceedingly low. It has also been experimentally observed that the resulting nitride trap density is near optimum for memory storage. During deposition of dielectric layer 32 with the hydrogen carrier gas, the hydrogen diffuses through layer 31 to produce low surface state density. In addition, the resulting conductivity of second dielectric layer 32 is much lower than that of layer 31 which is believed to contribute to the significantly higher memory retention properties exhibited by the invention.

While the preferred thickness of the composite dielectric layer consisting of layers 31 and 32 is about 650 A ±50 A, the optimum range of thickness is from about 450 to about 850 A±50 A. Best results have been obtained with devices having dielectric layers 31, 32 in the ratio of 1:2 (33⅓% thickness for layer 31 compared to combined thickness of layers 31 and 32); the optimum range, however, of the relative thickness of layers 31, 32 is from about 1:4 to about 1:1 (from about 20% to about 50% thickness layer 31).

Figure 5:
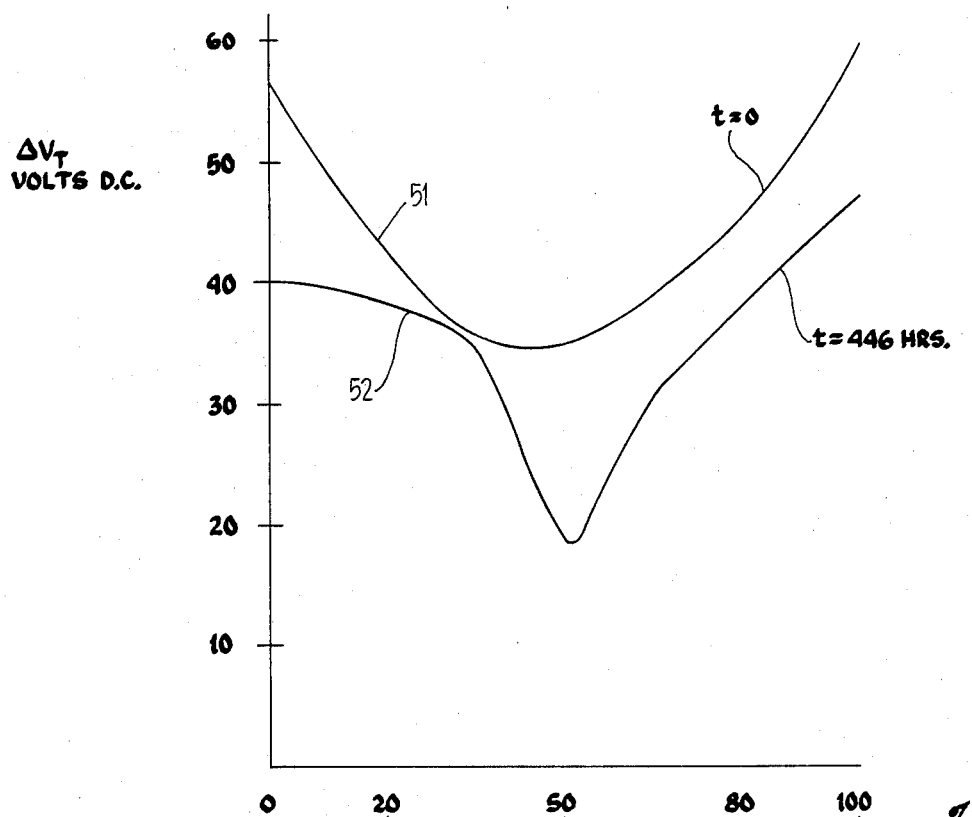
FIGS. 5 – 7 are graphs illustrating several electrical characteristics of the invention.

FIG. 5 is a plot of threshold voltage differential $\Delta V_t$, defined above, versus relative thickness of layers 31, 32 with the abscissa scaled in precent thickness of layer 31. Upper curve 51 represents the variation of $\Delta v_t$ with percent thickness of layer 31 immediately after fabrication of the device is complete ($t_o$); lower curve 52 represents variation of $\Delta V_t$ with percent thickness of layer 51 after a total lifetime of 446 hours of the same device. As is evident from a comparison of curves 51 and 52, $\Delta V_t$ exhibits no change with a percent thickness of 33 ⅓% for layer 31 over the time span measured. The variation of $\Delta V_t$ with time is approximately 0.5 volt at the lower end (20%) of the optimum thickness range and about 1.7 volts at the upper end (50%) of the optimum range.

Figure 6:
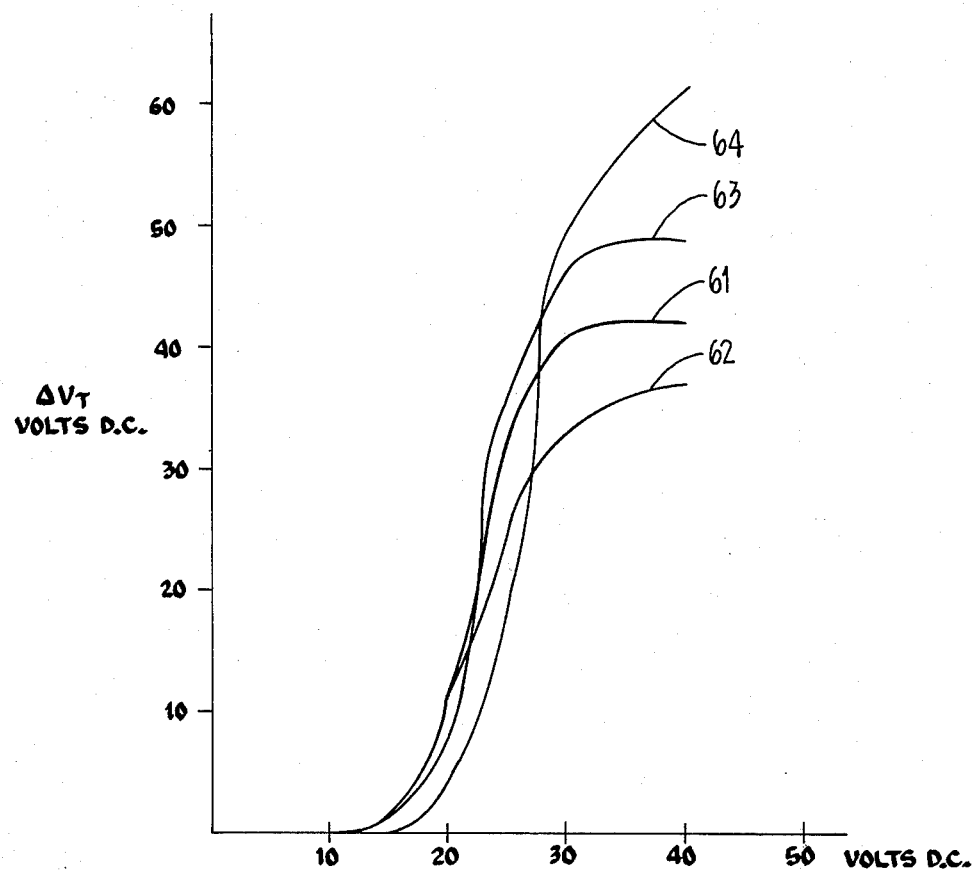

FIG. 6 illustrates the variation of $\Delta V_t$ with the magnitude of the write/erase voltage applied between the gate electrode 20 and the substrate 15 of the device of FIG. 4. Curves 61-64 represent the variation of $\Delta V_t$ with applied field voltage for four different devices having percentage thickness of layer 31 of 33⅓%, 50%, 75% and 100%, respectively. Minimum variation of $\Delta V_t$ over the normal range of field voltages is seen to occur for the device having percentage thickness of 33⅓% (curve 61). This data was obtained using write pulses of one millisecond duration and erase pulses of 100 millisecond duration.

Figure 7:
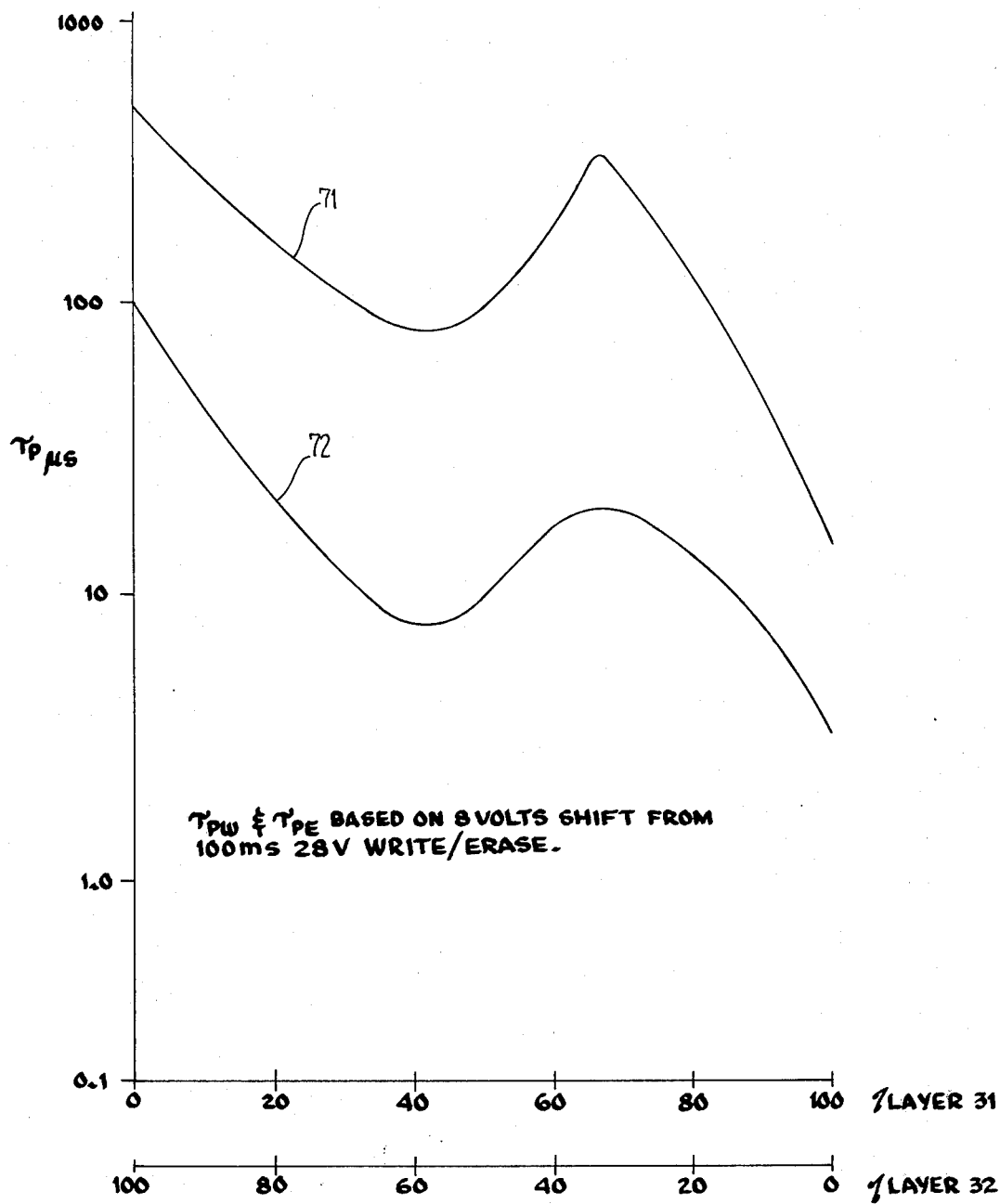

FIG. 7 is a plot of the variation of the minimum pulse widths required to unambiguously write and erase a memory device against percentage thickness of layer 31. The ordinate is drawn on a logharithmetic scale with microsecond divisions. As is evident from the FIGURE, in the preferred thickness range from about 20% to about 50%, the erase time ranges from a maximum of about 180 microseconds to a minimum of about 85 microseconds (curve 71), while the write time ranges from the maximum of about 25 microseconds to a minimum of about 8 microseconds.

As will now be apparent, MNOS IGFETS fabricated in accordance with the teachings of the invention exhibit extremely stable memory retention, hysteresis and other electrical characteristics. Further, excellent yields have been obtained using the method of the invention. In addition, the electrical characteristics of devices fabricated in accordance with the teachings of the invention have been found to be extremely reproducible from batch to batch.

There are many uses to which the invention may be applied. These applications include non-volatile shift registers for bulk storage, high speed read mostly memories and random access read/write memories. All applications utilize the desirable properties of MNOS technology, viz, (a) non-volatile storage capability which requires no standby power and reduces overall power requirements for semiconductor memory storage, (b) non-destructive high speed read out for applications requiring a simple read access of stored information, (c) high element density per LSI wafer and (d) compatibility with MOS logic elements on the same chip.

While the above provides a full and complete disclosure of the preferred embodiments of the invention, various modifications, alternate constructions and equivalents may be employed without departing from the true spirit and scope of the invention. Therefore the above description and illustrations should not be construed as limiting the scope of the invention which is defined by the appended claims.

What is claimed is:

1. An insulative gate field effect transistor comprising a semiconductive substrate of a first conductivity type; a pair of spaced semiconductive diffusion regions of opposite conductivity type to said first conductivity type, said diffusion regions being separated by an interstitial portion of said substrate and sharing a common boundary surface therewith; a field oxide layer adhered to said common boundary surface, said layer having a minimum thickness in the region thereof overlying said interstitial portion and a substantially greater thickness in the remaining regions thereof; a composite dielectric layer having a total thickness in the range from about 450A ±50A to about 850A ±50A and including a first layer adhered to said oxide layer and a second layer adhered to said first layer, said first dielectric layer having a thickness in the range from about 20% to about 50% of said total thickness of said composite dielectric layer, said second dielectric layer having an electrical conductivity less than the electrical conductivity of said first dielectric layer; and an electrically conductive electrode in direct contact with said second layer in the region overlying said interstitial substrate portion.

2. The combination of claim 1 wherein said first and opposite conductivity types are N and P types, respectively.

3. The combination of claim 1 wherein said field oxide comprises silicon dioxide.

4. The combination of claim 1 wherein said minimum thickness of said oxide layer is no greater than about 20 A.

5. The combination of claim 1 wherein said first and second dielectric layers each comprises silicon nitride.

6. The combination of claim 1 wherein said first dielectric layer has a thickness of about 33⅓% of the total thickness of said composite dielectric layer.

7. The combination of claim 1 wherein said total thickness of said composite dielectric layer is about 650A ± 50A.

* * * * *